United States Patent [19]

Calamera

[11] Patent Number: 5,367,299
[45] Date of Patent: Nov. 22, 1994

[54] METHOD FOR 5-BIT CHUNK ENCODING OF BIT SERIAL DATA BY A DATA PROCESSOR HANDLING DATA IN 8-BIT BYTE SEGMENTS

[75] Inventor: Pablo M. Calamera, San Jose, Calif.

[73] Assignee: Apple Computer, Inc., Cupertino, Calif.

[21] Appl. No.: 69,905

[22] Filed: Jun. 1, 1993

[51] Int. Cl.$^5$ .............................................. H03M 7/40
[52] U.S. Cl. ........................................ 341/95; 341/67
[58] Field of Search ............................. 341/95, 67, 60

[56] References Cited

U.S. PATENT DOCUMENTS

| | | | |
|---|---|---|---|
| 3,761,697 | 9/1973 | Stanley | 341/95 |
| 4,623,874 | 11/1986 | Thoma | 341/95 |
| 4,623,983 | 11/1986 | Meguerdichian | 364/900 |
| 4,855,742 | 8/1989 | Verboom | 341/102 |
| 5,079,548 | 1/1992 | Fujiyama et al. | 341/67 |

*Primary Examiner*—Marc S. Hoff
*Attorney, Agent, or Firm*—Mark A. Aaker

[57] ABSTRACT

A method for 5-bit chunk encoding of bit serial data by a data processor handling data in 8-bit byte segments, the method comprising the steps of:

setting a bit shift counter (bsc) to zero;

receiving data from the bit serial data to be stored into 8-bit bytes, such that at least two 8-bit bytes are available, the bit serial data stored in the 8-bit bytes from the most-significant bit to least significant bit;

shifting left the data in the first byte, by the value of the bsc;

encoding the data contained in the first two bytes in two 5-bit chunks;

incrementing the bsc by an increment of 2, and if the bsc is then equal to 8, resetting it to zero;

offsetting the data to the next whole byte boundary of the 8-bit byte data, dropping already processed bytes; and so long as there is data, repeating the steps of receiving, shifting, incrementing, and offsetting.

10 Claims, 2 Drawing Sheets

METHOD FOR 5-BIT CHUNK ENCODING OF BIT SERIAL DATA BY A DATA PROCESSOR HANDLING DATA IN 8-BIT BYTE SEGMENTS

BACKGROUND OF THE INVENTION

This invention relates to a method of encoding data by a data processor, and in particular to a method of efficiently processing and encoding 8-bit data into 5-bit data segments.

When information is processed by a data processing device, it is often necessary or convenient to store the data in an encoded form such as 5-bits per character. However, all commonly available data processors are designed to preferably handle data in 8-bit byte units. Therefore, what is desired is an efficient method of encoding 8-bit data into 5-bit data on a data processor handling data in 8-bit byte units.

It is also desirable that this method work on data which is input or output serially, that is, the bits are in sequential order, and the entire string of data is not immediately available for input or output. An example of this type of operation is where 8-bit data is to be encoded into 5-bit data and output via a serial data line to an output device, such as a printer.

While the encoding or conversion process can be accomplished by a bit-serial approach which reads and process one bit at a time, what is preferable is to have a "chunk" encoding process which processes and encodes several bits or bytes at a time, and therefore requires fewer operations by the data processor. This makes it a more desirable method for slower processors as well as suitable for real time applications in which data is arriving and being encoded at the same time.

SUMMARY OF THE INVENTION

This invention provides a method for 5-bit chunk encoding of bit serial data by a data processor handling data in 8-bit byte segments, the method comprising the steps of:

setting a bit shift counter (bsc) to zero;

receiving data from the bit serial data to be stored into 8-bit bytes, such that at least two 8-bit bytes are available, the bit serial data stored in the 8-bit bytes from the most-significant bit to least significant bit, and from a first and leftmost byte to a last and rightmost byte;

shifting left the data in the first byte, by the value of the bit shift counter;

encoding the data contained in the first two bytes in two 5-bit chunks;

incrementing the bit shift counter by an increment of 2, and if the bit shift counter is then equal to 8, resetting it to zero;

offsetting the data to the next whole byte boundary of the 8-bit byte data, dropping already processed bytes; and so long as there is data, repeating the steps of receiving, shifting, incrementing, and offsetting.

DETAILED DESCRIPTION

Figure 1:
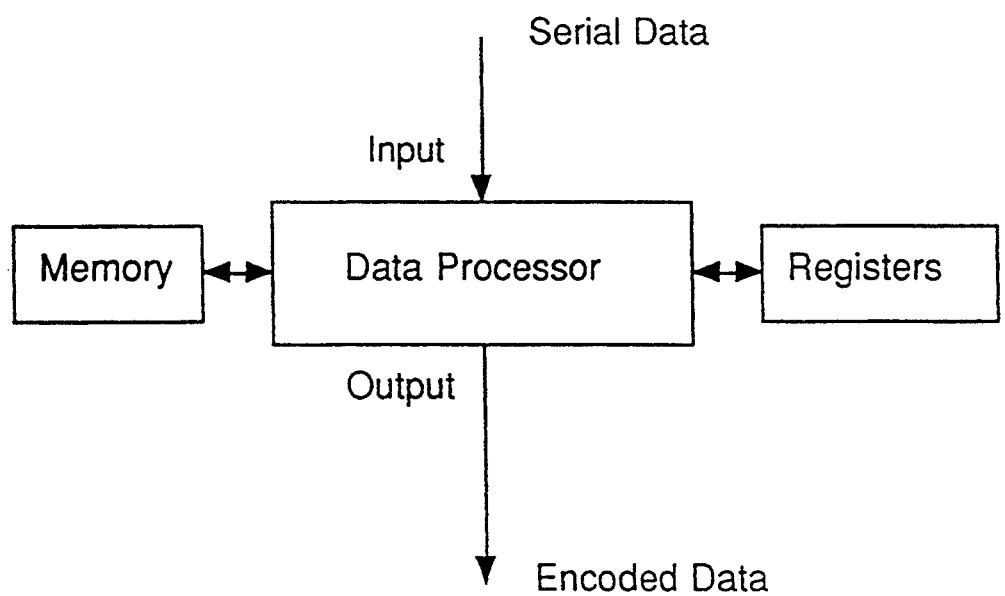
FIG. 1 shows a pictorial diagram of an apparatus for performing the method for 5-bit chunk encoding of bit serial data by a data processor handling data in 8-bit byte segments in accordance with this invention.

FIG. 1 shows a pictorial diagram of an apparatus for performing the method for 5-bit chunk encoding of bit serial data by a data processor handling data in 8-bit byte segments in accordance with this invention.

A data processor is connected to a memory and storage registers for storage of data during processing. In a data processor which preferably addresses data in 8-bit byte units, these storage registers can be considered as 8-bit storage registers, whether internal or external to the data processor. The data processor is also connected to input and output data paths, which may be parallel or serial I/O. For the method of this invention, bit serial data is received at the data processor, or is generated within the data processor and is stored in the storage registers and memory. During the encoding process, data is stored and processed in the storage registers, replaced by new data, and the encoded data is output from the data processor in a 5-bit encoded form.

For this example, a 5-bit encoding will be used. Note that any encoding scheme can be substituted. The 5-bit encoding example simply takes 8 bits of data and represents it using 5 bits. It may be desirable to use a 5-bit encoding where the 5-bit chunks are to be mapped through a special character table for encoding into characters for printing.

To perform the encoding in chunks, rather than one bit at a time, the data is processed 2-bytes at a time. Since we want to convert eight bits of data to 5 bits, we can take two 8-bit bytes, and retrieve two 5-bit numbers from them, with some bits remaining to be used in the next 5-bit chunk. These unprocessed bits are retrieved by shifting to the left an appropriate number of bits at each pass through the encoding process. For example, the first time through the process, you encode the leftmost bits, the second time through the process you need to shift over 2 bits before encoding, the next time 4 bits, and the next time 6 bits. After that, you have encoded 40 bits of data which means you have completed a full 5 bytes, at which point you can set the bit shift counter back to 0 and repeat the steps of processing.

Figure 2:
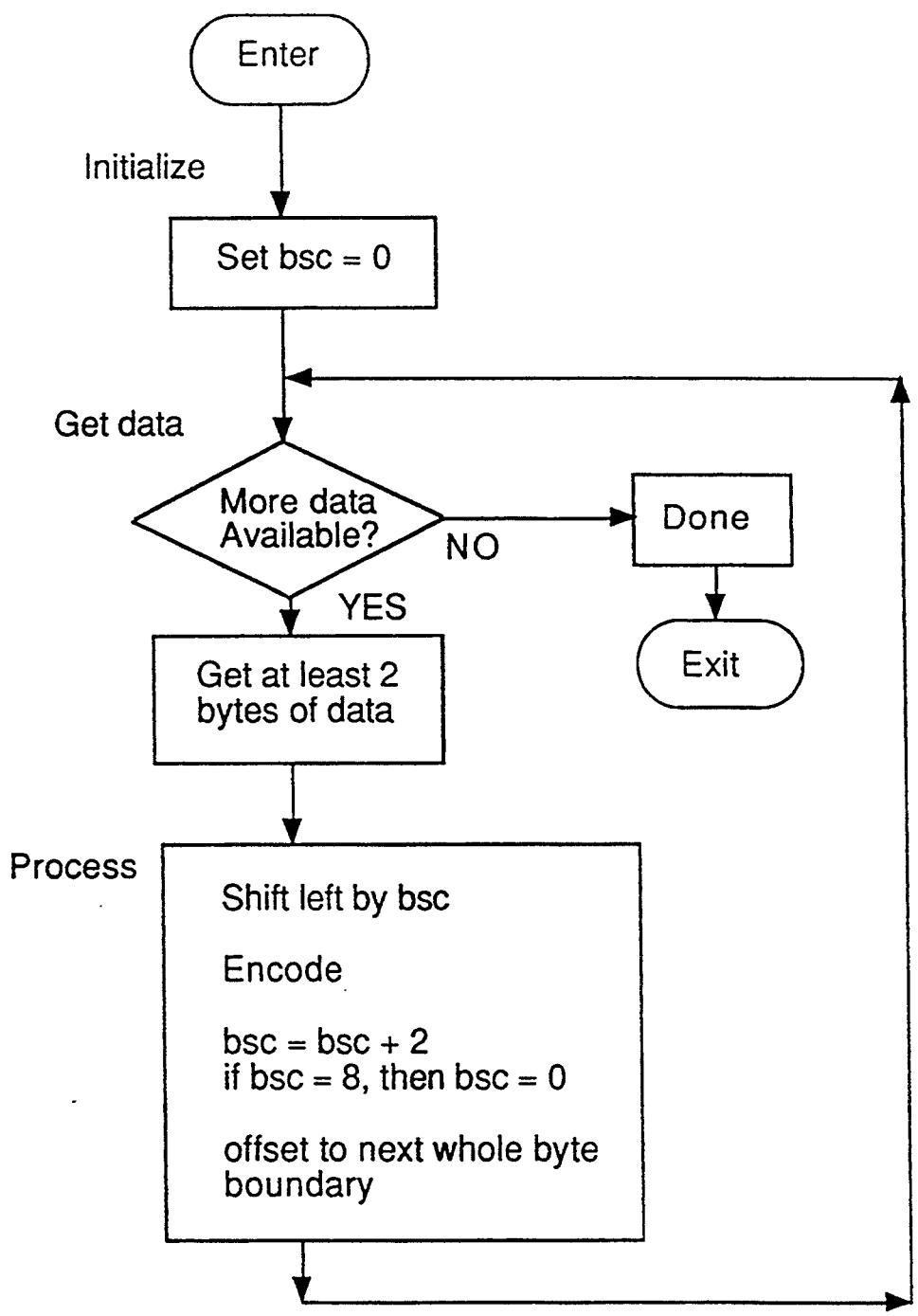
FIG. 2 shows a symbolic flowchart of a method for 5-bit chunk encoding of bit serial data by a data processor handling data in 8-bit byte segments in accordance with this invention.

FIG. 2 shows a symbolic flowchart of a method for 5-bit chunk encoding of bit serial data by a data processor handling data in 8-bit byte segments in accordance with this invention.

The method includes the overall steps of Initialize, Get data, and Process data. The method is performed so long as there is data to process, or until interrupted by other computer system processes.

In a first step of Initialize, actions to initialize the operation are performed. These include as a minimum, to set a bit shift counter (bsc) to zero.

In a next step of Get data, actions to obtain and store data for processing are performed. These include as a minimum, checking to see if more data is available, and if not, then exiting the method. If more data is available, then perform an obtaining, receiving, or accessing the data so that at least the minimum amount of data needed are available by being stored in registers associated with the data processor, For 5 bit chunk encoding described herein, it is required to store at least two 8-bit bytes of data for processing, although additional bytes can be stored in preparation of further processing. When the end of data is reached, a preferred form of the method includes padding the data with zeros to fill to the next whole byte boundary.

In a next step of Process data, actions to process the data and encode it into 5-bit chunks are performed. These include as a minimum, shifting the data left by the current value of the bsc. This may involve actual shifting of the data within "shift registers" or may be accomplished by moving the position of a "address pointer" to the new starting position of the data, or may be accomplished by bit masking and copying operations within registers or memory locations.

Next, the encoding is performed, for example, two 5 bit chunks are encoded from the stored data. The bsc is updated to count the number of already processed bits still being stored. In this example of 5-bit chunk encoding from two 8-bit bytes, the bsc is incremented by 2. ((2 chunks*5-bits)−(8 bits per byte)=2 bits) If the bsc reaches 8, it is reset to zero. That is, the bsc counts modulo 8, and in steps of two. The counting sequence for the bsc will be 0, 2, 4, 6, 0, 2, 4, 6, 0, 2, ... and so on. Finally, the input data is offset to the next whole unprocessed 8-bit byte boundary. This involves shifting the data so that all fully-processed 8-bit bytes are removed, and that all unprocessed data data remains stored. This operation may be as simple as moving the position of a "pointer" to the starting position of the next byte of data, or by incrementing a byte-valued address counter to the next whole value. Note that after this offset to the next whole byte boundary, the first byte may have both processed and unprocessed data within it. The location within the first byte of the start of unprocessed data is indicated by the value of the bsc.

The method then loops back to get additional data, if any, for further processing and encoding.

As a further example, the method will be outlined and the serial data shown. For clarity, the bits of the serial data will be numbered 0–7 within each byte, rather than each bit merely having a value of 0 or 1. Encoded bits will be shown as "xxxxx". Also, all bits will be shown remaining in place rather than shifted off to the left. A carat " ^ " below the line will show the current location at which a pointer indicates processing is to continue on the data.

---

Set the bsc = 0.
The data is stored in 8-bit byte units as follows:
  01234567 01234567 01234567 01234567 01234567 ...
  ^
Since the bsc = 0, no shifting left is needed.
Two 5 bit numbers are encoded:
  xxxxxyyy yy234567 01234567 01234567 01234567 ...
The bsc is incremented by two, bsc = 0 + 2 = 2.
The bsc is not ≥ 8, so it is not reset to zero.
Now offset the pointer to the next whole 8-bit byte boundary:
  xxxxxyyy yy234567 01234567 01234567 01234567 ...
           ^
And repeat the process:
The serial input data is stored in 8-bit byte units as follows:
  xxxxxyyy yy234567 01234567 01234567 01234567 ...
           ^
Since the bsc = 2, shift the pointer left by two bits:
  xxxxxyyy yy234567 01234567 01234567 01234567 ...
             ^
Two 5 bit numbers are encoded:
  xxxxxyyy yyxxxxx yyyy4567 01234567 01234567 ...
             ^
The bsc is incremented by two, bsc = 2 + 2 = 4.
The bsc is not ≥ 8, so it is not reset to zero.
Now offset the pointer to the next whole 8-bit byte boundary:
  xxxxxyyy yyxxxxxy yyyy4567 01234567 01234567 ...
                    ^
And so on ...

We continue this method until 5 bytes are processed and we're back at 0 bit shifts. Note that the 5-bit encoding can be another encoding scheme, in which case the bit shift would be adjusted as necessary.

Appendix I contains example C programming code for implementing portions of this method for the a Motorola 68000-family data processor.

Other embodiments and variations of the invention will be apparent to one skilled in the art. It is intended that the scope of the invention be limited only by the scope of the following claims.

APPENDIX I

```
#define kFirst5BitNumber 31
#define k5Bits 5
#define kSecond5BitNumber 26
unsigned GetLongBits(long x, long p, short n)
{
    return (x >> (p+1−n)) &~(~0 << n);
}
void GetNextLong(Ptr data, long offset, long *I)
{
    long    tempLong;
    long    result = *I;
    result = result << 8;          // make room for next byte
    tempLong = data[offset];       // grab a byte
    tempLong = tempLong &          // mask uneeded bits out
       0x000000FF;
    result = result | tempLong;    // add to result
    *I = result;
}
void InitLong(Ptr data, long *I)
{
    short    i;
    long     result = 0;
    for (i=0;i<4;i++)              // grab first 4 bytes in data block
        GetNextLong(data, i, &result);
    *I = result;
}
void DrawSpecialChar(long value, Boolean firstNumber, long
*valuesCount, short *charCount, short *lineCount, long
leftMargin, short characters)
{
    unsigned    u;
    if (*valuesCount)
    {
        if (firstNumber)
            u = GetLongBits(value, kFirst5BitNumber, k5Bits);
        else
            u = GetLongBits(value, kSecond5BitNumber, k5Bits);
        if (*charCount ==         // stick up to "characters"
          characters)             characters per line
        {
            PositionPen(leftMargin);
            *charCount = 0;       // re-init
            *lineCount = *lineCount + 1;
        }
        *charCount = *charCount + 1;
        *valuesCount = *valuesCount - 1;
        DrawChar(gEncodingCharacterSet[u]);
    }
}
Boolean DrawEncodedRequest(Ptr data, long numValues, long
leftMargin, short characters, short lines)
{
    long       value;
    long       tempLong;
    short      offset;
    Boolean    completed    = true;
    short      lineCount    = 0;
    short      charCount    = 0;
    long       valuesCount  = numValues;
    long       dataOffset   = 4;    // start four bytes
                                    in after InitLong
    ASSERT(data);
    InitLong(data, &tempLong);      // grab first long in data block
    value = tempLong;
    while (valuesCount)
    {
        for (offset = 0; offset <= 6; offset += 2)
        {
            value = value << offset;
            DrawSpecialChar(value, kFirstNumber,
   &valuesCount, &charCount, &lineCount, leftMargin, characters);
            DrawSpecialChar(value, kSecondNumber,
   &valuesCount, &charCount, &lineCount, leftMargin, characters);
```

APPENDIX I-continued

```
        GetNextLong(data, dataOffset, &tempLong);
        value = tempLong;
        dataOffset++;
        }
    GetNextLong(data, dataOffset, &tempLong);
    value = tempLong;
    dataOffset++;
    if (lineCount > lines)
        {
        completed = false;
        break;
        }
    }
    return completed;
}
```

I claim:

1. A method for 5-bit chunk encoding of bit serial data by a data processor handling data in 8-bit byte segments, the method comprising the steps of:

for a bit shift counter counting from zero to 6 by increments of 2, modulo base 8, the data processor repeating the steps of;

receiving data in 8-bit bytes so long as there is available data;

shifting left the data by the value of the bit shift counter;

encoding the data in two 5-bit chunks;

incrementing the bit shift counter by an increment of 2, and offsetting to the next whole byte boundary of the data, by moving the position of a pointer to the starting position of the next byte of data.

2. A method as in claim 1 including padding with zeros on a least significant bit side of the data when the bit serial data ends, to fill to the next whole byte boundary.

3. A method as in claim 1 where the shifting step is performed in a storage register.

4. A method as in claim 1 where the 5 bit chunks are then mapped through a special character table for encoding into characters for printing.

5. A method for 5-bit chunk encoding of bit serial data by a data processor handling data in 8-bit byte segments, the method comprising the steps of:

setting a bit shift counter (bsc) to zero;

receiving data from the bit serial data into stored 8-bit bytes, such that at least two 8-bit bytes are available, the bit serial data stored in the 8-bit bytes from the most-significant bit to least significant bit;

shifting left the data in the first byte, by the value of the bsc;

encoding the data contained in the first two bytes in two 5-bit chunks;

incrementing the bsc by an increment of 2, and if the bsc is then equal to 8, resetting it to zero;

offsetting the data to the next whole byte boundary of the 8-bit byte data, by moving the position of a pointer to the starting position of the next byte of data, dropping already processed bytes; and so long as there is data, repeating the steps of receiving, shifting, incrementing, and offsetting.

6. A method as in claim 5 including padding with zeros on the least significant bit side of the data when the bit serial data ends, to fill to the next whole byte boundary.

7. A method as in claim 5 where the data is stored in storage registers.

8. A method as in claim 5 where the shifting step is performed in a storage register.

9. A method as in claim 5 where the 5 bit chunks are then mapped through a special character table for encoding into characters for printing.

10. A method for 5-bit chunk encoding of bit serial data by a data processor handling data in 8-bit byte segments stored in storage registers, the method comprising the steps of:

setting a bit shift counter register to a zero condition;

receiving data from the bit serial data to be stored into 8-bit bytes, such that at least two 8-bit bytes are available, the bit serial data stored in the 8-bit bytes from the most-significant bit to least significant bit, and stored in hardware registers;

shifting left the data in the first byte, by the value of the bsc;

encoding the data contained in the first two bytes in two 5-bit chunks;

incrementing the bsc by an increment of 2, and if the bsc is then equal to 8, resetting it to zero;

offsetting the data to the next whole byte boundary of the 8-bit byte data, by moving the position of a pointer to the starting position of the next byte of data, dropping already processed bytes; and so long as there is data, repeating the steps of receiving, shifting, incrementing, and offsetting.

* * * * *